United States Patent
Metzgen et al.

(10) Patent No.: US 7,358,767 B1
(45) Date of Patent: Apr. 15, 2008

(54) EFFICIENT MULTIPLEXER FOR PROGRAMMABLE CHIPS

(75) Inventors: Paul Metzgen, Chiswick (GB); Dominic Nancekievill, High Wycombe (GB)

(73) Assignee: Altera Corporation, San Jose, CA (US)

( * ) Notice: Subject to any disclaimer, the term of this patent is extended or adjusted under 35 U.S.C. 154(b) by 33 days.

(21) Appl. No.: 10/870,518

(22) Filed: Jun. 16, 2004

Related U.S. Application Data (60) Provisional application No. 60/534,662, filed on Jan. 6, 2004.

(51) Int. Cl.
  *H03K 19/173* (2006.01)
  *H03K 17/00* (2006.01)
(52) U.S. Cl. .................. 326/46; 326/40; 327/407
(58) Field of Classification Search .......... 326/39, 326/38, 46, 40, 105; 327/407; 716/16
See application file for complete search history.

(56) References Cited

U.S. PATENT DOCUMENTS

| | | | |
|---|---|---|---|
| 5,546,018 A * | 8/1996 | New et al. .................. | 326/38 |
| 6,086,629 A | 7/2000 | McGettigan et al. | |
| 6,118,300 A * | 9/2000 | Wittig et al. .................. | 326/41 |
| 6,236,229 B1 * | 5/2001 | Or-Bach ....................... | 326/39 |
| 6,476,634 B1 * | 11/2002 | Bilski ........................... | 326/40 |
| 2003/0231766 A1 * | 12/2003 | Hanounik ..................... | 380/43 |

OTHER PUBLICATIONS

Nancekievill, et al., "An Efficient 4:1 Multiplexer for Programmable Chips", Altera Corporation, U.S. Appl. No. 10/997,792, filed Nov. 24, 2004, pp. 1-31.
Mitra et al., "Efficient Multiplexer Synthesis Techniques", Multiplexer Synthesis, IEEE Design & Test of Computers, Oct.-Nov. 2000, pp. 2-9.
Office Action dated May 5, 2006, U.S. Appl. No. 10/997,792.
Final Office Action, U.S. Appl. No. 10/997,792, mailed Oct. 23, 2006 [ALTRP153/A1967].
Office Action, U.S. Appl. No. 10/997,792, mailed Feb. 26, 2007 [ALTRP153/A1967].
Notice of Allowance, U.S. Appl. No. 10/997,792, mailed Aug. 10, 2007 [ALTRP153/A1967].
Allowed claims, U.S. Appl. No. 10/997,792, mailed Aug. 10, 2007 [ALTRP153/A1967].

* cited by examiner

*Primary Examiner*—Daniel Chang
(74) *Attorney, Agent, or Firm*—Beyer Weaver LLP (57) ABSTRACT

Methods and apparatus are provided for implementing efficient multiplexers on a programmable chip using a lookup table. A load logic input line associated with a lookup table having limited input lines is used to augment the number of input lines that can be handled by a particular lookup table. Load logic and a lookup table having four input lines can be used to implement a 3:1 multiplexer having five input lines.

26 Claims, 9 Drawing Sheets

| $C_1$ 401 | $C_0$ 403 | Output 405 |
|---|---|---|
| 0 | 0 | $d_0$ |
| 0 | 1 | $d_1$ |
| 1 | 0 | $d_2$ |
| 1 | 1 | $d_2$ |

EFFICIENT MULTIPLEXER FOR PROGRAMMABLE CHIPS

CROSS REFERENCE TO RELATED APPLICATIONS

This application claims benefit of priority under 35 U.S.C. 119(e) of (i) U.S. Provisional Application No. 60/534,662 filed Jan. 6, 2004 and titled "AN EFFICIENT MULTIPLEXER FOR PROGRAMMABLE CHIPS", the entirety of which is incorporated by reference for all purposes.

BACKGROUND OF THE INVENTION

1. Field of the Invention

The present invention relates to implementing a multiplexer using a small set of resources on a programmable chip. In one example, the present invention relates to methods and apparatus for efficiently implementing a 3:1 multiplexer using minimal resources.

2. Description of Related Art

Conventional processors including general purpose processors, digital signal processors, video accelerators, and other hardware devices typically use multiplexer circuitry. Multiplexer circuitry allows one of multiple input lines to be selected for output based on control information. One particular multiplexer that is often used is a 3:1 multiplexer. A 3:1 multiplexer allows selection of one of three inputs for output based on control information usually provided by two control lines.

Multiplexers are implemented in a variety of manners. For devices such as application specific integrated circuits (ASICs), multiplexers are relatively inexpensive to implement. However, on devices such us field programmable gate arrays (FPGAs) or other programmable chips, multiplexers can be more resource intensive and can also introduce undesired delay into a processing data path. Conventional mechanisms for implementing multiplexers such as 3:1 multiplexers are relatively limited.

Consequently, the techniques of the present invention provide mechanisms for improving the efficiency of multiplexer implementation on programmable chips.

SUMMARY OF THE INVENTION

Methods and apparatus are provided for implementing efficient multiplexers on a programmable chip using a lookup table. A load logic input line associated with a lookup table having limited input lines is used to augment the number of input lines that can be handled by a particular lookup table. Load logic and a lookup table having four input lines can be used to implement a 3:1 multiplexer having five input lines.

In one embodiment, a programmable chip having a multiplexer is provided. The multiplexer includes a lookup table and load logic. The lookup table is operable to receive a first data input, a second data input, and a first control input. The lookup table is configured to provide an intermediate output as a function of the first data input, the second data input, and the first control input. Load logic is operable to receive the intermediate output, a third data input, and a second control input and provide an output value associated with the multiplexer. The output value is provided as a function of the intermediate input, the third data input, and the second control input.

In another embodiment, a 3:1 multiplexer having three data input lines, two control lines, and an output line is provided. The 3:1 multiplexer includes a first 2:1 multiplexer and a second 2:1 multiplexer. The first 2:1 multiplexer has two inputs and a first control line. The first 2:1 multiplexer is implemented using a lookup table. The second 2:1 multiplexer has two inputs and a second control line. The output of the first 2:1 multiplexer is coupled to an input of the second 2:1 multiplexer. The second 2:1 multiplexer is implemented using load logic associated with the lookup table.

In another embodiment, a programmable chip system is provided. The programmable chip system includes a primary component, a secondary component coupled to the primary component, and a plurality of logic elements. At least one logic element is used to implement a multiplexer. The multiplexer includes lookup table means operable to receive a first data input, a second data input, and a first control input. The lookup table means is configured to provide an intermediate output as a function of the first data input, the second data input, and the first control input. Load logic means is operable to receive the intermediate output, a third data input, and a second control input and provide an output value associated with the multiplexer. The output value is provided as a function of the intermediate input, the third data input, and the second control input.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of particular processors and memory.

For example, the techniques of the present invention will be described in the context of particular processors. However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention. Furthermore, techniques and mechanisms of the present invention will sometimes be described in singular form for clarity. However, it should noted that some embodiments can include multiple iterations of a technique or multiple instantiations of a mechanism unless noted otherwise. For example, a processor is used in a variety of contexts. However, it will be appreciated that multiple processors can also be used while remaining within the scope of the present invention.

Many devices including programmable chips use multiplexers such as 3:1 multiplexers to perform a variety of operations. Any logic or mechanism that takes three inputs and provides an output based on control information is herein referred to as a 3:1 multiplexer. In one embodiment, a 3:1 multiplexer is a hardware component that takes three discrete inputs and two control lines and outputs one of the three discrete inputs. Every input can be output through a unique value of the control lines.

Typical 3:1 multiplexers are implemented in a variety of manners. Many programmable chips include lookup tables (LUT), registers, and routing resources. Lookup tables have N inputs and 1 output. An N input LUT can compute any function of up to N binary inputs. A 3:1 multiplexer is a function of three data inputs and two control inputs for a total of five inputs. The LUTs in many programmable chip architectures such as field programmable gate arrays (FPGAs) have four inputs.

Consequently, a 3:1 multiplexer with five inputs can not fit in a four input LUT, because it is a function of five inputs. It is possible to build a 3:1 multiplexer using two 2:1 multiplexers. A 2:1 multiplexer can be a function of as little as three inputs, i.e., two data lines and one control line. Many implementations build 3:1 multiplexers using two four-input LUTs, each of which implements one 2:1 multiplexer.

Figure 1:
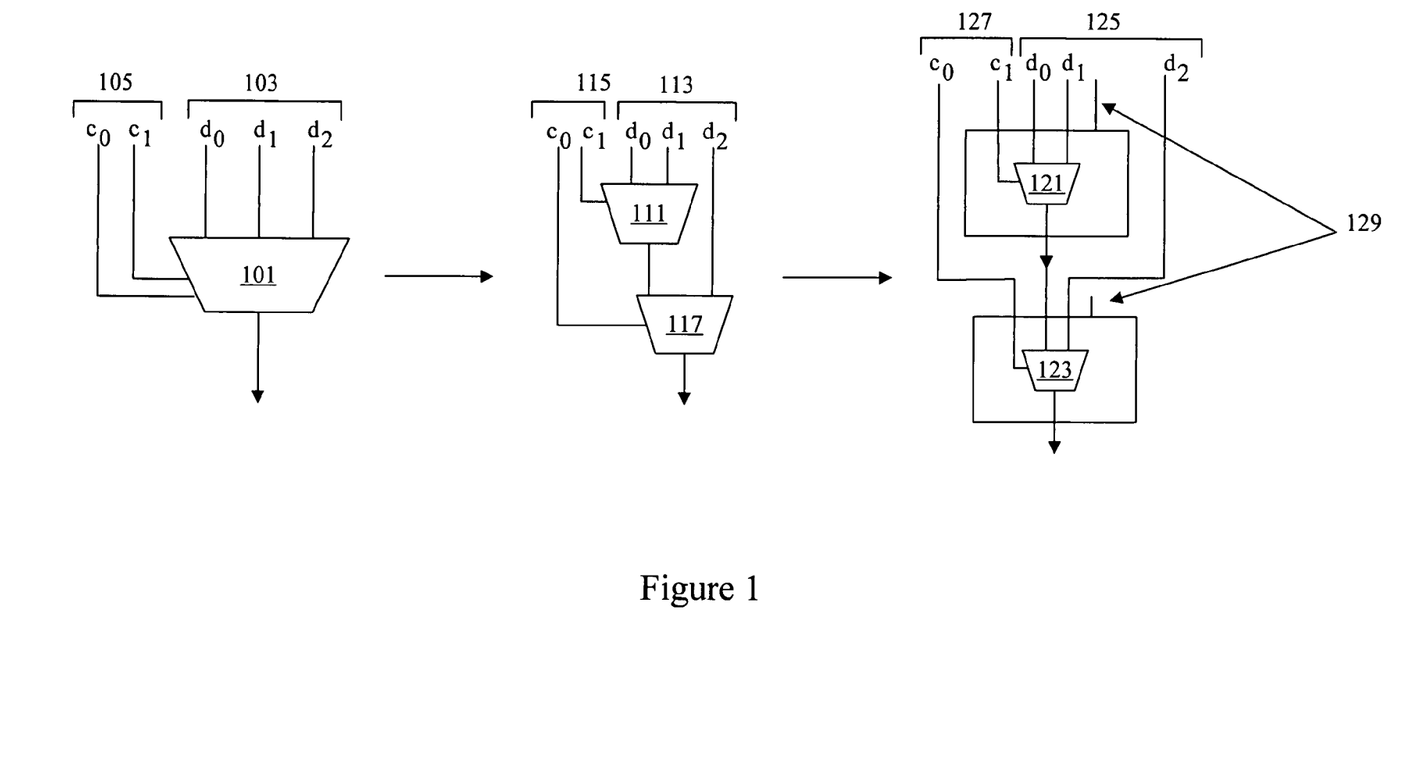
FIG. 1 is a diagrammatic representation showing one example of a 3:1 multiplexer.

FIG. 1 is a diagrammatic representation showing one example of a 3:1 multiplexer implemented using two LUTs and register pairs. A 3:1 multiplexer includes three input data lines 103 and two control lines 105. According to various embodiments, each input data line and each control line is a single bit. A 3:1 multiplexer 101 can be implemented using two 2:1 multiplexers. Two 2:1 multiplexers 111 and 117 take input data lines 113 along with control lines 115 to allow implementation of a 3:1 multiplexer. Each 2:1 multiplexer can be implemented using a four input lookup table. According to various embodiments, a pair of 2:1 multiplexers are implemented using lookup tables 121 and 123. Lookup table 121 takes two data input lines from the set of data input lines 125 and takes a control line from the set of control lines 127 and provides an intermediate value to a second lookup table 123. The second lookup table 123 takes the intermediate value and the remaining data and control lines and provides a multiplexer output value.

As will be appreciated, each lookup table is associated with a lookup table delay. Consequently, to optimize efficiency, it is typically beneficial to minimize the use of lookup tables and interconnections between lookup tables. Although lookup tables are used to implement a 3:1 multiplexer, resources remain unused. For example, input lines 120 line remain unconnected as only three inputs of each four input lookup table are used.

However, the techniques of the present invention recognize that resources are wasted when a 3:1 multiplexer is implemented using two LUTs and register pairs. Consequently, techniques and mechanisms are provided for improving the implementation of 3:1 multiplexers and other N:1 multiplexers.

According to various embodiments, many programmable chips such as FPGAs provide a register for every LUT. The register input is fed by the LUT. Often, logic is provided between the LUT output and the register input to allow the register value to be loaded independent of the LUT. For example, the register may be loaded by either the LUT or some other mechanism.

Figure 2:
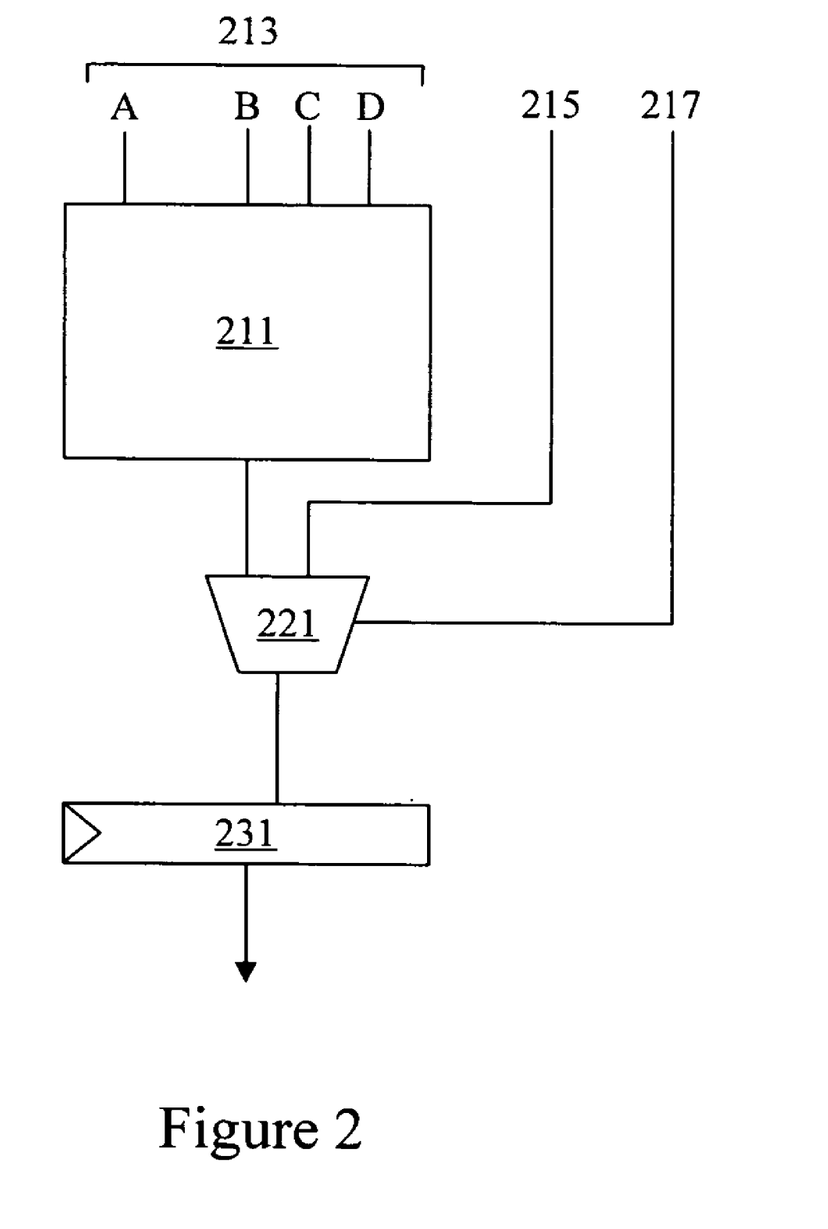
FIG. 2 is a diagrammatic representation showing a lookup table.

FIG. 2 is a diagrammatic representation showing a lookup table and an associated register. Lookup table 211 has four input lines to 213 and provides an input value to logic 221. In one example, logic 221 is selection logic provided with a lookup table. The logic 221 is used to take either the output of the lookup table 211 and provide the output to the register 231 or take an input 215 and provide the input 215 to the register 231. The value selected is based on a control line 217. However, if the output of the 3:1 multiplexer is intended to feed a register, then the logic 221 can be used for other purposes. According to various embodiments, the logic 221 is used implement a 3:1 multiplexer.

Figure 3:
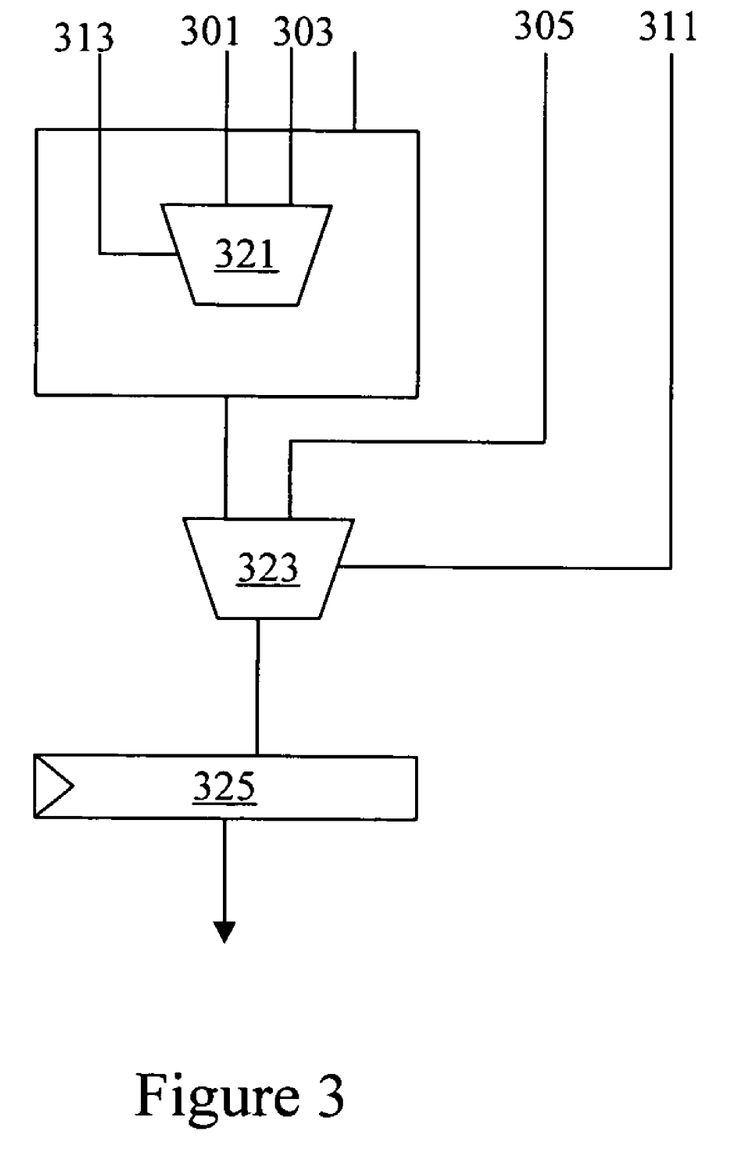
FIG. 3 is a diagrammatic representation showing a lookup table implemented as a 3:1 multiplexer.

FIG. 3 is a diagrammatic representation showing various data lines and control lines handled by a single lookup table and associated load logic. Any logic or mechanism used to select either the output of a lookup table or in input value from some other source to provide to a particular register is referred to herein as load logic. The lookup table 321 takes input data lines 301 and 303 along with control line 313 and provides an intermediate value to logic 323. Logic 323 takes data input 305, the intermediate value provided from the lookup table 321, and a control line 311 and provides an output value to a register 325. According to various embodiments, load logic 323 is a 2:1 multiplexer associated with a lookup table.

The multiplexer is implemented as a pair of 2:1 multiplexers. One multiplexer is provided by the LUT, the other is provided by the LOAD logic. Any logic or mechanisms associated with a LUT for selecting a value to provide to a register is referred to herein as load logic.

A multiplexer implemented using a LUT and the load logic is smaller than a conventional 3:1 multiplexer, as it requires only 1 LUT/register pair per 3:1 multiplexer. Typical implementations required 2 LUT/register pairs. The multiplexer of the present invention is also faster, and only has the delay associated with one LUT. Typical implementations required two LUT delays and a routing delay from one LUT to the other. A typical 3:1 multiplexer implemented using 2 LUTs would use 2 lookup tables, 2 load logic circuits, and 2 different registers. However, by using a single LUT, the 3:1 multiplexer can be implemented using a single LUT, a single load logic circuit, and a single register.

Figure 4:
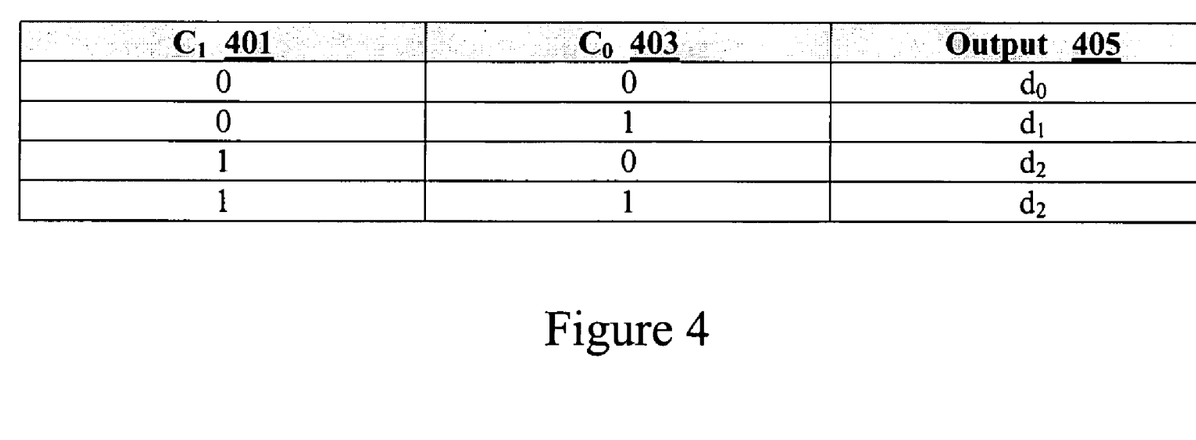
FIG. 4 is a table representation showing one arrangement of multiplexer output values as a function of input values.

FIG. 4 is a table representation showing output values as a function of input. Control signals 401 and 403 can be used to select one of three input data lines d0, d1, and d2 for output as output value 405. It should be appreciated that a variety of bit configurations can be used to select output values. The particular arrangement shown is one example of a possible bit configuration. For example, instead of having control line 401 select between outputs d2 and the intermediate value (d0 or d1 selected based on c0), the control line 403 can be used to select between the intermediate value and d2.

Figure 5:
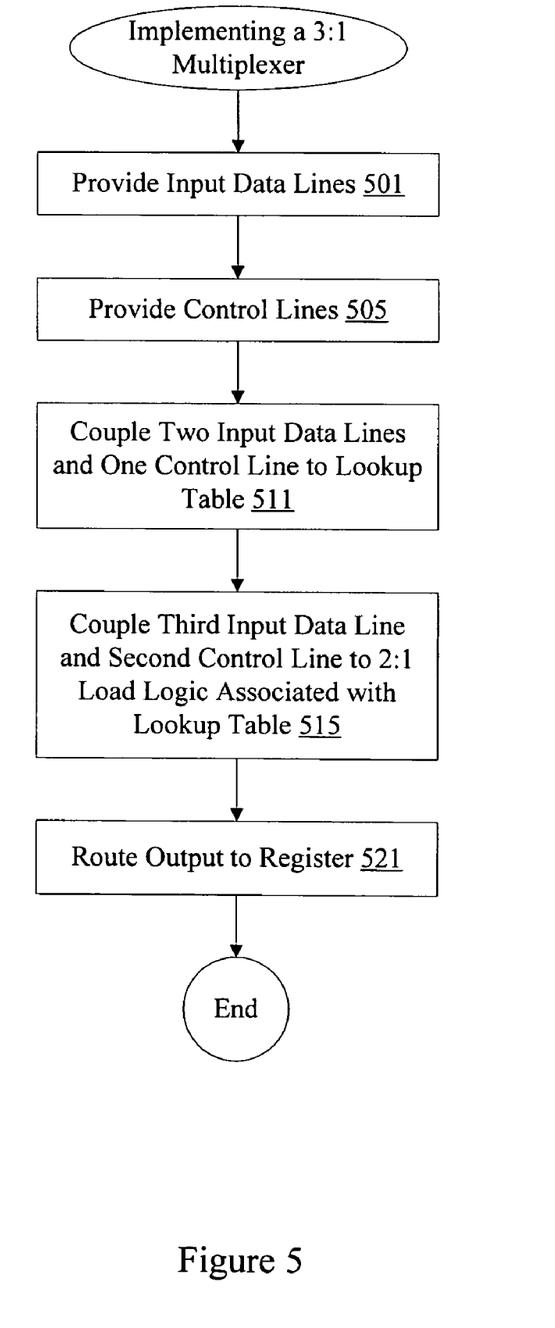
FIG. 5 is a flow process diagram showing a technique for implementing a 3:1 multiplexer.

FIG. 5 is a flow process diagram showing one technique for implementing a 3:1 multiplexer. At 501, input data lines are provided. At 505, control lines are provided. According to various embodiments, two control lines are used to select between three data input lines. Similarly, one or four data input lines could also be selected using two control lines. However, selecting from five input data lines would typically require three control lines. Consequently, it should be appreciated that the techniques of the present invention can be applied to other multiplexers of different size and not simply 3:1 multiplexers. For example, the techniques of the present invention can be applied toward implementing a 4:1 multiplexer using a single lookup table.

To implement a 3:1 multiplexer, however, two input data lines and one control line are coupled to a lookup table at 511. At 515, a third input data line and a second control line are coupled to 2:1 load logic associated with the lookup table. At 521, the output is routed to the register.

The techniques and mechanisms of the present invention can be implemented on a variety of devices. FIG. 5 is a flow process diagram showing one technique for implementing a 3:1 multiplexer.

Although the techniques and mechanisms of the present invention or applicable to a variety of different processors including general purpose processors, video accelerators, cryptography accelerators, digital signal processors, microcontrollers, etc., the techniques and mechanisms of the present invention or particularly applicable to soft core processors on programmable chips and programmable chip systems. Logic is often at a premium on programmable chips, so the reduction in core sizes using the reset address line invalidate mechanism is often particularly beneficial.

Figure 6:
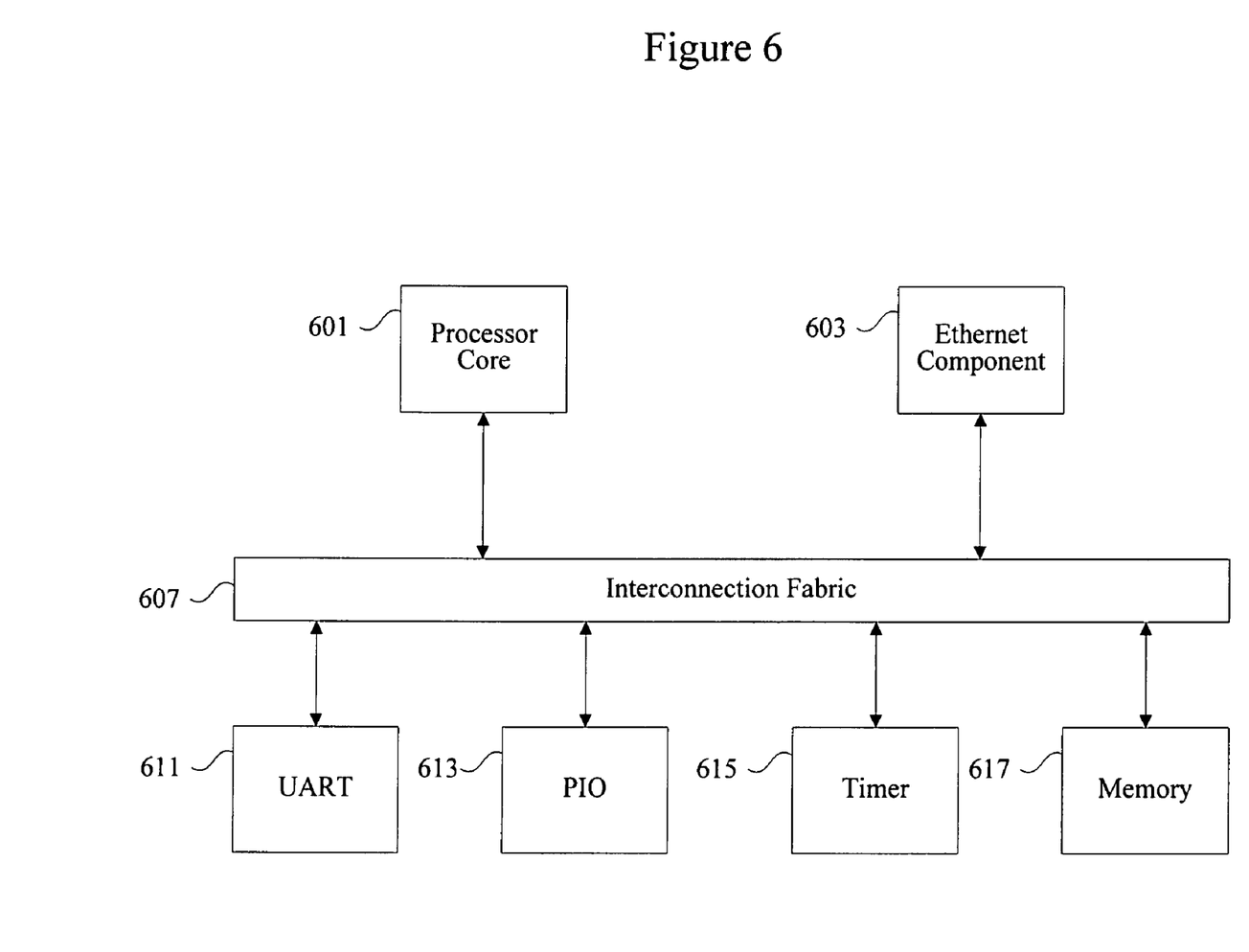
FIG. 6 is a diagrammatic representation of a programmable chip.

FIG. 6 is a diagrammatic representation showing one example of a system on a programmable chip that can be used to implement the techniques of the present invention. The system includes a processor core, a hardware accelerator, peripheral devices, and peripheral interfaces. Peripheral devices and peripheral interfaces are herein referred to as components. The system on a programmable chip includes processor core 601 and an Ethernet component 603 as well as peripheral components UART 611, PIO 613, timer 615, and data memory 617. In some examples, the Ethernet component 103 is instead a Digital Signal Processing (DSP) core, a cryptography accelerator, or a video processor. It should be noted that the system can include both on-chip memory 617 and off-chip memory. In one example, the data memory 617 can support variable latency or fixed latency access. The components are interconnected using an interconnection fabric 607. Any mechanism or logic for connecting components in a system is referred to herein as an interconnection fabric. In one example, the interconnection fabric is a bus. In another example, the interconnection fabric is a secondary side arbitration fabric.

The programmable chip uses different types of resources that can be interchangeably used in different allocations to implement the system on a programmable chip. In one example, the programmable chip uses logic elements for implementing each of the various components on the programmable chip.

Logic elements typically can be implemented using components such as antifuses, static RAM, and EPROMS. Any mechanism on a programmable chip that performs an operation on a given number of input lines to provide one or more outputs based on information programmed is herein referred to as a logic element. Some logic elements are implemented as combinations of lookup tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

The techniques and mechanisms of the present invention allow the implementation of a system on a programmable chip from a high-level language program. In one example, variable latency and fixed latency can be supported on a system using a conventional bus architecture.

A system bus typically has a set width (e.g. 64 bits, 128 bits) and allows only one primary component to actively use the bus at any one time. In conventional systems, only one primary component can access any one of the given secondary components at any given time. Multiple primary components accessing secondary components in a manner that would cause data bit collisions if performed on the same data lines is referred to herein as accessing secondary components at the same time.

In one example, an Ethernet component is accessing a secondary PIO. While the Ethernet component is accessing the secondary PIO, a processor can not access an SDRAM through a peripheral interface even if both the primary streaming output device and the peripheral interface are available.

According to various embodiments of the present invention, it is recognized that a bus is no longer required in certain applications such as system on a chip, system on a programmable chip, and other computer system implementations. A device such as a programmable logic device (PLD) or a field programmable gate array (FPGA) using a hardware descriptor language (HDL) is herein referred to as a programmable chip or a programmable device. Instead of implementing complicated bus sharing schemes using mechanisms such as splitting, the bus itself can be eliminated to improve system performance.

According to specific embodiments, it is recognized that primary components and secondary components need not be routed through a construct such as a bus. By not routing signals through a bus, a streaming output device can be implemented in a much more efficient manner. The conventional data and address lines that make up the bus are no longer the resource in contention. Instead, secondary components are resources in contention, as the number of physical lines connected to each secondary component in a system can be fixed. Furthermore, by not using a bus, interconnection flexibility is enhanced. For example, an Ethernet component can be allocated a variety of ports for directly accessing a memory and the only resource in contention would be the memory.

Consequently, a system bus arbitrator associated with all the secondary components in a computer system is no longer needed. Instead, secondary components themselves that may be accessed by more than one primary component are assigned individual secondary side arbitrators. An arbitrator that corresponds to a specific secondary component accessible by more than one primary component is referred to herein as a secondary side arbitrator. In one embodiment, there is a secondary side arbitrator for each secondary component in a computer system. In other embodiments, there is a secondary side arbitrator for selected secondary components in a system. The techniques of the present invention recognize that Ethernet component support for high-level language programs can be more efficiently and effectively provided in a system by using secondary side arbitration.

Figure 7:
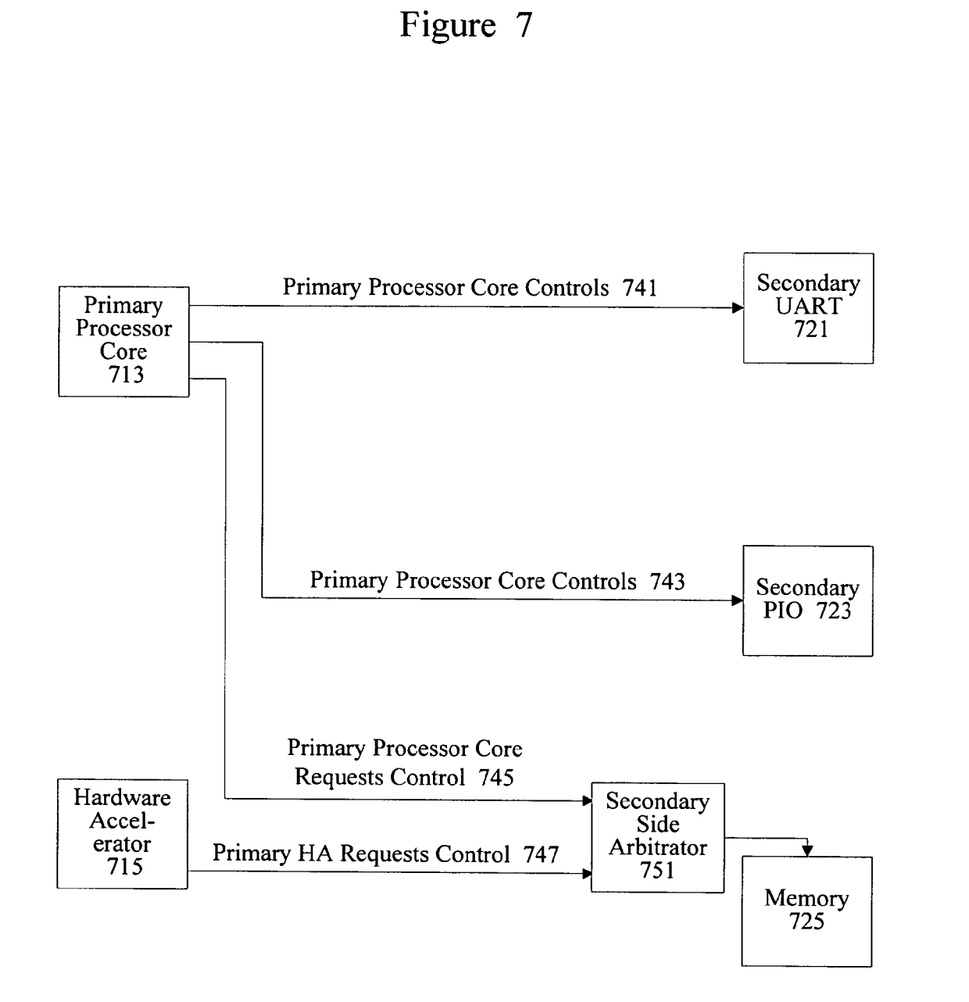
FIG. 7 is a diagrammatic representation showing an interconnection fabric.

FIG. 7 is a diagrammatic representation showing one example of a system using secondary side arbitration, sometimes referred to as slave side arbitration, simultaneous multiple primary components, or simultaneous multiple masters. A system using individual arbitrators that correspond to individual secondary components accessible by more than one primary component is referred to herein as a secondary side arbitration system. The secondary side arbitration system no longer requires a bus or a system bus arbitrator that prevents a second primary component from accessing a second secondary component when a first primary component is accessing a first secondary component. According to various embodiments, a secondary component such as peripheral interface 725 is associated with a secondary side arbitrator 751. However, secondary components UART 721 and PIO 723 are not associated with any arbitrator. In one example, secondary component UART 721 and secondary PIO 723 can only be accessed by primary CPU 713 and not by primary Ethernet device 715. A secondary memory component 725, however, can be accessed by both primary CPU 713 and primary Ethernet device 715.

According to various embodiments, a secondary side arbitrator 751 allows a first secondary component in a system to be accessed by a first primary component at the same time a second secondary component in the system is accessed by a second primary component. For example, peripheral interface 725 can be accessed by primary Ethernet 715 through secondary side arbitrator 751 at the same time, secondary UART 721 is accessed by primary CPU 713.

By allowing a CPU to access a secondary component at the same time another primary component such as a streaming output device or an Ethernet component is accessing memory, bus bottlenecks can be reduced. By using the simultaneous multiple primary component architecture, more direct connections between components can also be supported.

Figure 8:
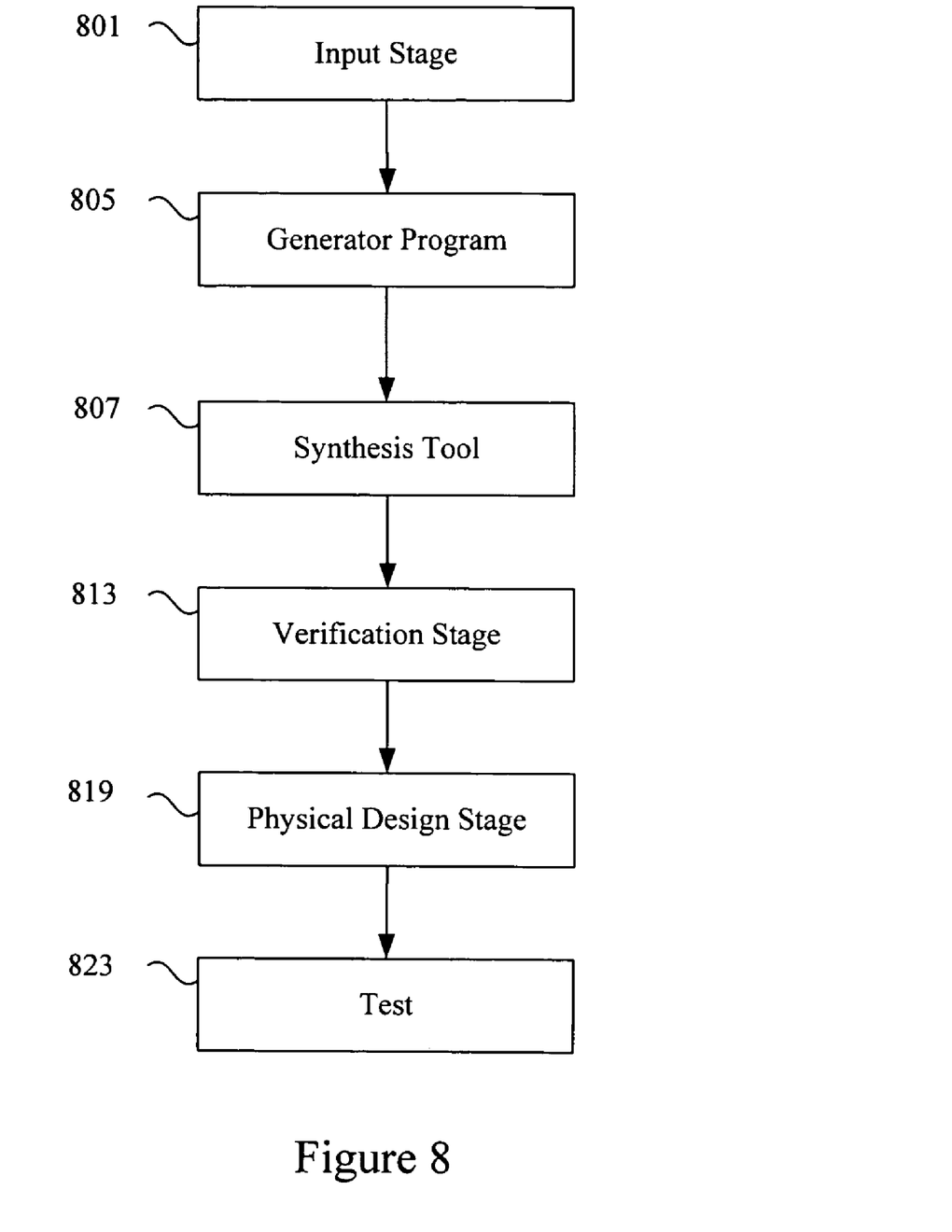
FIG. 8 is a diagrammatic representation showing a technique for implementing the programmable chip.

FIG. 8 is a diagrammatic representation showing implementation of a system on a programmable chip. An input stage 801 receives selection information typically from a user for logic such as a processor core as well as other components such as a streaming output device to be implemented on an electronic device. In one example, the input received is in the form of a high-level language program. A generator program 805 creates a logic description and provides the logic description along with other customized logic to any of a variety of synthesis tools, place and route programs, and logic configuration tools to allow a logic description to be implemented on an electronic device.

In one example, an input stage 801 often allows selection and parameterization of components to be used on an electronic device. The input stage 801 also allows configuration of variable or fixed latency support. In some examples, components provided to an input stage include intellectual property functions, megafunctions, and intellectual property cores. The input stage 801 may be a graphical user interface using wizards for allowing efficient or convenient entry of information. The input stage may also be a text interface or a program reading a data file such as a spreadsheet, database table, or schematic to acquire selection information. The input stage 801 produces an output containing information about the various modules selected.

In typical implementations, the generator program 805 can identify the selections and generate a logic description with information for implementing the various modules. The generator program 805 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 805 identifies pointers and provides ports for each pointer. One tool with generator program capabilities is System on a Programmable Chip (SOPC) Builder available from Altera Corporation of San Jose, Calif. The generator program 805 also provides information to a synthesis tool 807 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 809.

As will be appreciated by one of skill in the art, the input stage 801, generator program 805, and synthesis tool 807 can be separate programs. The interface between the separate programs can be a database file, a log, or simply messages transmitted between the programs. For example, instead of writing a file to storage, the input stage 801 can send messages directly to the generator program 805 to allow the generator program to create a logic description. Similarly, the generator program can provide information directly to the synthesis tool instead of writing HDL files. Similarly, input stage 801, generator program 805, and synthesis tool 807 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 807.

A synthesis tool 807 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 813 typically follows the synthesis stage 807. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 813, the synthesized netlist file can be provided to physical design tools 819 including place and route and configuration tools. A place and route tool typically locates logic cells on specific logic elements of a target hardware device and connects wires between the inputs and outputs of the various logic elements in accordance with logic required to implement an electronic design. The device can also be physically tested at 823.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be tested using various techniques of the present invention.

As noted above, different stages and programs can be integrated in a variety of manners. According to one embodiment, the input stage 801, the generator program 805, the synthesis tool 807, the verification tools 813, and physical design tools 819 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 9:
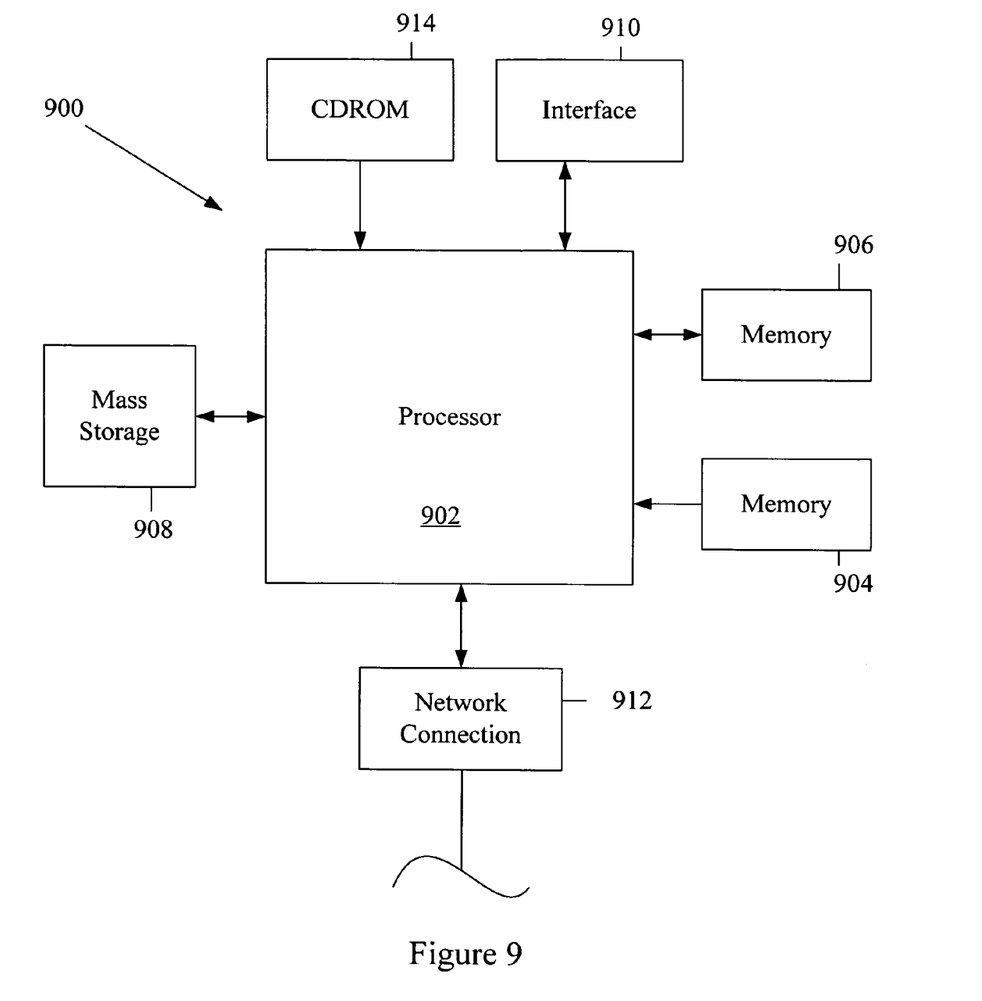
FIG. 9 is a diagrammatic representation depicting a computer system.

FIG. 9 illustrates a typical computer system that can be used to implement a programmable chip having shared I/O lines. The computer system 900 includes any number of processors 902 (also referred to as central processing units, or CPUs) that are coupled to devices including memory 906 (typically a random access memory, or "RAM"), memory 904 (typically a read only memory, or "ROM"). The processors 902 can be configured to generate a test sequences for any designated processor. As is well known in the art, memory 904 acts to transfer data and instructions unidirectionally to the CPU and memory 906 is used typically to transfer data and instructions in a bi-directional manner. Both of these memory devices may include any suitable type of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a secondary storage medium such as a hard disk that is slower than memory. The mass storage device 908 can be used to hold a library or database of prepackaged logic or intellectual property functions, as well as information on generating particular configurations. It will be appreciated that the information retained within the mass storage device 908, may, in appropriate cases, be incorporated in standard fashion as part of memory 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 902 optionally may be coupled to a computer or telecommunications network using a network connection as shown generally at 912. With such a network connection, it is contemplated that the CPU might receive information from the network, or might output information to the network in the course of performing the above-described method steps. It should be noted that the system 900 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 908 or 914 and executed on CPU 908 in conjunction with primary memory 906.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of primary and secondary components and should not be restricted to the ones mentioned above. It is therefore intended that the invention be interpreted to include all variations and equivalents that fall within the true spirit and scope of the present invention.

What is claimed is:

1. A programmable chip comprising:
   a multiplexer operable to receive a first data input, a second data input, a third data input, a first control input, a second control input, and provide an output value, the multiplexer comprising:
      a lookup table operable to receive the first data input, the second data input, and the first control input, wherein the lookup table is configured to provide an intermediate output as a function of the first data input, the second data input, and the first control input;
      load logic hard coded with the lookup table prior to synthesis of the programmable chip, the load logic operable to receive the intermediate output, the third data input, and the second control input and provide the output value, the output value provided as a function of the intermediate input, the third data input, and the second control input.

2. The programmable chip of claim 1, wherein the first data input, the second data input, the third data input, the first control input, and the second control input are bits.

3. The programmable chip of claim 2, wherein the first control input is used to select either the first data input or the second data input as the intermediate output.

4. The programmable chip of claim 2, wherein the second control input is used to select either the third data input or the intermediate output as the output value associated with the multiplexer.

5. The programmable chip of claim 1, wherein the multiplexer is implemented on a programmable chip.

6. The programmable chip of claim 1, wherein the lookup table is a four input lookup table.

7. The programmable chip of claim 2, wherein the load logic is a multiplexer associated with the lookup table to allow a register to be loaded with an external value regardless of the output of the lookup table.

8. The programmable chip of claim 1, wherein the multiplexer is a 3:1 multiplexer implemented with a single lookup table.

9. A 3:1 multiplexer having three data input lines, two control lines, and an output line, the 3:1 multiplexer, comprising:
  a first 2:1 multiplexer, the first 2:1 multiplexer having two inputs and a first control line, the first 2:1 multiplexer implemented using a lookup table;
  a second 2:1 multiplexer having two inputs and a second control line, the output of the first 2:1 multiplexer coupled to an input of the second 2:1 multiplexer, wherein the second 2:1 multiplexer is implemented using load logic associated with the lookup table, wherein load logic is hard coded with the first 2:1 multiplexer prior to synthesis of the programmable chip.

10. The programmable chip of claim 9, wherein the lookup table is a four input lookup table.

11. The programmable chip of claim 9, wherein load logic is associated with a register.

12. The programmable chip of claim 11, wherein load logic is used to determined if the output of the first 2:1 multiplexer should be provided to the register.

13. The programmable chip of claim 11, wherein load logic is used to allow the output of the four input lookup table to be overridden.

14. The programmable chip of claim 11, wherein load logic is used to allow the output of the four input lookup table to loaded independent of the lookup table.

15. The programmable chip of claim 9, wherein the 3:1 multiplexer is provided on a programmable chip.

16. The programmable chip of claim 9, wherein only three of the four inputs of the four input lookup table are used.

17. The programmable chip of claim 9, wherein the 3:1 multiplexer is associated with only a one lookup table delay.

18. A programmable chip system, comprising:
  a primary component,
  a secondary component coupled to the primary component,
  a plurality of logic elements, wherein at least one logic element is used to implement a multiplexer comprising:
    lookup table means operable to receive a first data input, a second data input, and a first control input, wherein the lookup table means is configured to provide an intermediate output as a function of the first data input, the second data input, and the first control input;
    load logic means operable to receive the intermediate output, a third data input, and a second control input and provide an output value associated with the multiplexer, the output value provided as a function of the intermediate input, the third data input, and the second control input, wherein load logic is hard coded with the lookup table prior to synthesis of the programmable chip.

19. The programmable chip of claim 18, wherein the first data input, the second data input, the third data input, the first control input, and the second control input are bits.

20. The programmable chip of claim 19, wherein the first control input is used to select either the first data input or the second data input as the intermediate output.

21. The programmable chip of claim 19, wherein the second control input is used to select either the third data input or the intermediate output as the output value associated with the multiplexer.

22. The programmable chip of claim 18, wherein lookup table means includes a four input lookup table.

23. The programmable chip of claim 22, wherein load logic means includes a 2:1 multiplexer associated with the lookup table, the 2:1 multiplexer allowing a register to be loaded regardless of the lookup table.

24. The programmable chip of claim 18, wherein the multiplexer is a 3:1 multiplexer implemented with a single lookup table.

25. The programmable chip of claim 18, wherein the programmable chip includes logic elements and memory.

26. The programmable chip of claim 25, wherein the primary component and secondary component are interconnect using a simultaneous multiple primary component fabric.

* * * * *